(12) United States Patent (10) Patent No.: US 7,746,682 B2
Oliva et al. (45) Date of Patent: Jun. 29, 2010

(54) SEU HARDENED LATCHES AND MEMORY CELLS USING PROGRAMMABLE RESISTANCE DEVICES

(75) Inventors: Antonietta Oliva, San Jose, CA (US); Vei-Han Chan, San Jose, CA (US)

(73) Assignee: Agata Logic Inc., Cupertino, CA (US)

( * ) Notice: Subject to any disclaimer, the term of this patent is extended or adjusted under 35 U.S.C. 154(b) by 464 days.

(21) Appl. No.: 11/591,881

(22) Filed: Nov. 2, 2006

(65) Prior Publication Data

US 2007/0165446 A1 Jul. 19, 2007

Related U.S. Application Data

(60) Provisional application No. 60/734,046, filed on Nov. 3, 2005.

(51) Int. Cl.
*G11C 11/00* (2006.01)
(52) U.S. Cl. .................................. 365/148; 365/154
(58) Field of Classification Search ................. 365/148, 365/154
See application file for complete search history.

(56) References Cited

U.S. PATENT DOCUMENTS

| | | | |
|---|---|---|---|
| 6,735,110 | B1 | 5/2004 | Lesea |
| 6,987,688 | B2 | 1/2006 | Lowrey et al. |
| 7,113,426 | B2 | 9/2006 | Rueckes et al. |
| 7,129,749 | B1 | 10/2006 | Fenstermaker et al. |
| 7,186,998 | B2 * | 3/2007 | Ovshinsky et al. ............ 257/3 |
| 7,206,217 | B2 * | 4/2007 | Ohtsuka et al. ............. 365/154 |
| 7,232,703 | B2 * | 6/2007 | Morita et al. ................ 438/102 |
| 7,336,525 | B2 * | 2/2008 | Fujita et al. ................. 365/154 |
| 2004/0105301 | A1 | 6/2004 | Toyoda et al. |
| 2004/0178401 | A1 | 9/2004 | Ovshinsky et al. |
| 2004/0188668 | A1 | 9/2004 | Hamann et al. |
| 2005/0062497 | A1 | 3/2005 | Pellizzer et al. |
| 2005/0167645 | A1 | 8/2005 | Kim et al. |
| 2006/0071244 | A1 | 4/2006 | Gutsche et al. |
| 2006/0097240 | A1 | 5/2006 | Lowrey et al. |
| 2006/0102927 | A1 | 5/2006 | Fujita et al. |
| 2006/0121391 | A1 | 6/2006 | Khang |
| 2006/0279978 | A1 | 12/2006 | Krusin-Elbaum et al. |

* cited by examiner

*Primary Examiner*—Hoai V Ho
(74) *Attorney, Agent, or Firm*—James M. Wu; JW Law Group

(57) ABSTRACT

Apparatus and methods for reducing single-event upsets (SEUs) in latch-based circuitry (e.g., static random access memory (SRAM) cells) and other digital circuitry. According to an exemplary embodiment, a latch-based circuit includes a radiation-hardened latch having first and second cross-coupled inverters and first and second programmable resistance devices (PRDs). The first PRD is coupled between the output of the first inverter and the input of the second inverter. The second PRD is coupled between the output of the second inverter and the input of the first inverter. The PRDs may be programmed to low or high-resistance states. When SET to a low-resistance state, the latch of the latch-based circuitry may be accessed to read the current logic state stored by the latch or to write a new logic state into the latch. When RESET to a high-resistance state, the latch is in a radiation-hard state, thereby preventing the latch from generating SEUs.

23 Claims, 8 Drawing Sheets

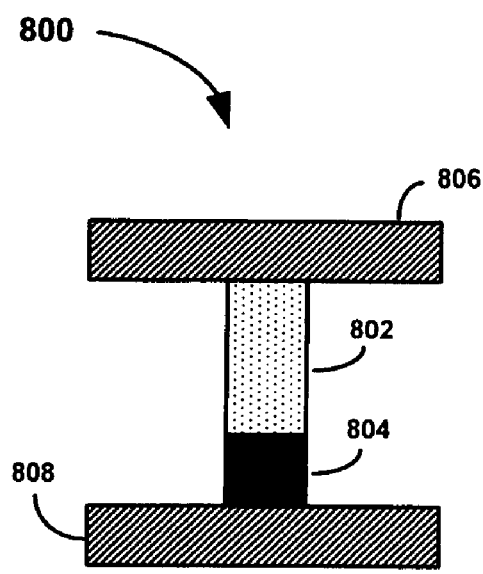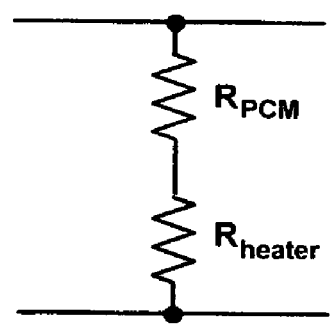
FIGURE 8AFIGURE 8B

FIGURE 9A
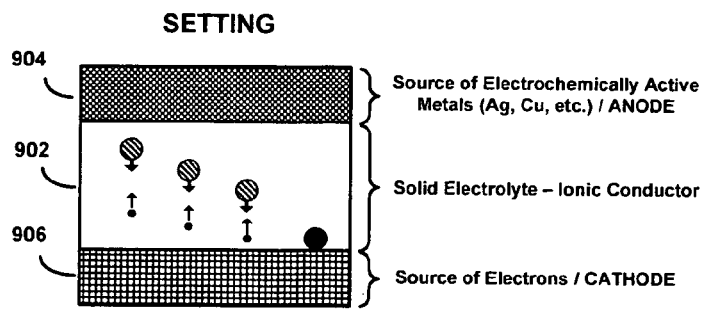
FIGURE 9B
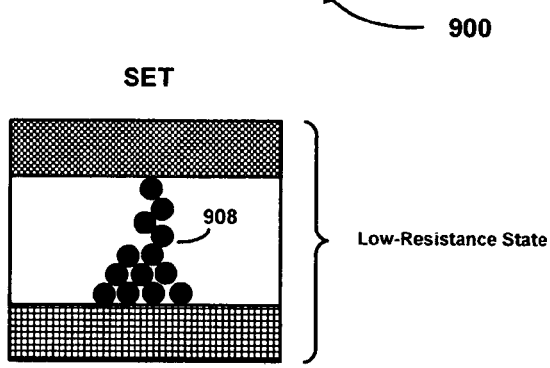
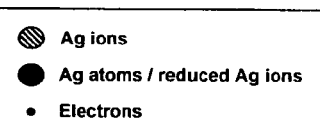
FIGURE 9C
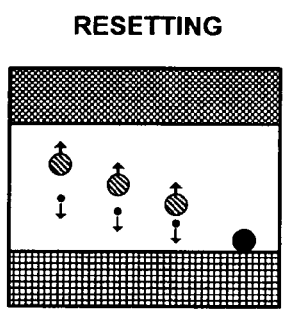
FIGURE 9D
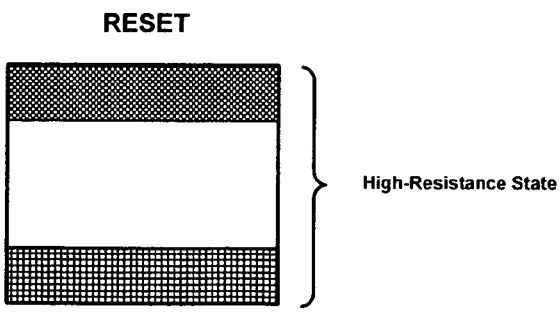

SEU HARDENED LATCHES AND MEMORY CELLS USING PROGRAMMABLE RESISTANCE DEVICES

CROSS-REFERENCE TO RELATED APPLICATIONS

This patent application claims the benefit of U.S. Provisional Patent Application No. 60/734,046, which was filed on Nov. 3, 2005.

FIELD OF THE INVENTION

The present invention is directed at electronic latch-based circuitry and memory cells. More specifically, the present invention is directed at reducing radiation-induced soft errors in electronic latch-based circuitry and memory cells using programmable resistance devices.

BACKGROUND OF THE INVENTION

Random access memory (RAM) is an indispensable component in electronic devices and systems. There are two main types of RAM—dynamic RAM (DRAM) and static RAM (SRAM). DRAM is the most common type of RAM used in computer systems. Its advantage over SRAM is its structural simplicity. Whereas a DRAM memory cell requires only a single transistor and capacitor, an SRAM memory cell requires six transistors. For this reason SRAM technology is not well-suited for high-capacity, low-cost applications such as personal computer (PC) memory. Nevertheless, SRAM technology has a number of benefits over DRAM technology. First, SRAM is faster (i.e., can be read and written to more quickly than DRAM). Second, SRAM cells do not need to be refreshed and are capable of reliably maintaining their logic state, so long as power is continuously supplied to the cell. By contrasts, DRAM cells must be periodically refreshed to ensure that the logic state stored by the cell is properly maintained. Sensing the DRAM cell, for example to refresh the cell, can be problematic in some applications since the refresh process temporarily disrupts the current logic state stored in the SRAM cell. For these reasons, SRAM technology is preferred over DRAM technology in some applications.

FIG. 1A is a schematic drawing of a conventional SRAM cell 100. The SRAM cell 100 comprises a latch 102, which includes two cross-coupled inverters 104, 106, and two access transistors 108, 110, which serve to control access to the latch 102 during read and write operations. FIG. 1B shows the SRAM cell 100 in FIG. 1A at a transistor level. The SRAM cell has three different states: a standby state, a read state, and a write state. When in the standby state, the access transistors 108, 110 are OFF and decouple the latch 102 from the bit lines, BL and $\overline{BL}$. The two cross-coupled inverters 104, 106 (comprising transistors 112, 114 and 116, 118, respectively) continue to reinforce each other.

The SRAM cell 100 is read as follows. Assume, for example, that the SRAM cell 100 is storing a logic "1" (logic "1" appears at terminal Q and logic "0" appears at $\overline{Q}$). The read cycle commences by precharging both bit lines, BL and $\overline{BL}$, to a logic "1" level. The word line, WL, is then asserted, thereby enabling both access transistors 108, 110. The Q and $\overline{Q}$ logic levels are transferred to the bit lines, BL and $\overline{BL}$, by leaving BL at its precharged value and discharging $\overline{BL}$ through transistors 108 and 118 to a logic "0". At the same time, transistors 110 and 112 pull BL up to the supply voltage, VDD, thereby pulling BL to a logic "1". If the SRAM cell 100 is configured to store a logic "0" at the start of the read cycle, the reverse process is performed, i.e., $\overline{BL}$ is pulled up to a logic "1" and BL is pulled down to a logic "0".

The SRAM cell 100 is written to by first applying the logic value to be written to the bit lines BL and $\overline{BL}$. For example to write a logic "0" to the cell 100, a logic "0" is asserted on BL and a logic "1" is asserted on $\overline{BL}$. This causes the latch 102 to change state from a logic "1" to a logic "0". Then the WL is asserted and the logic value to be written (in this example, a logic "0") is latched into the latch 102.

While SRAM technology is used in a wide variety of applications, it is a well knows fact that it is susceptible to radiation-induced soft errors. These soft errors (commonly referred to in the art as "single event upsets" (SEUs)), are caused by alpha particles, cosmic rays and nuclear reaction products of terrestrial neutrons and semiconductor material, which impinge on the transistors of the latch 102 and cause the latch 102 to unexpectedly and undesirably flip logic states. SEUs can lead to erroneous data and even system crashes. In some circumstances, SEUs may be corrected by rewriting correct data in place of erroneous data, e.g., by using sophisticated error correction circuitry (ECC). However, in other circumstances, it may be impossible to determine the correct data, or to discover that an error has even occurred.

On-chip memory such as SRAM is considered to be the most sensitive circuit component to SEUs, which are measured by what is known as the "soft error rate" (SER), since it typically occupies a substantial portion of the chip area, and since it usually has the lowest critical charge $Q_{crit}$ (i.e., the minimum amount of charge required to cause an upset). For this reason, ECC has largely been directed at correcting errors in memory portions of a chip to reduce the SER. While ECC has been shown to be effective at reducing memory SER, technology scaling trends indicate that logic SER could limit the benefit of ECC in the near future. This limitation is compounded by the fact that ECC tends to consume a large portion of semiconductor chip area, which makes it difficult to ensure all parts of the chip are immune to SEUs.

Aside from the deleterious effects on SER resulting from technology scaling, in some applications ECC does not provide a suitable or efficient means for reducing SER. For example, SRAM technology is often used to configure programmable logic devices, such as field programmable gate arrays (FPGAs). SRAM cells in an FPGA are used to configure the logic blocks, input/output (I/O) blocks and interconnect structure. Because the functions performed by the FPGA are determined by the logic values of the SRAM configuration memory cells, any error in the SRAM values can affect the intended functionality of the FPGA. Indeed, in an FPGA configured to implement a complex design, it is possible that a single error could render the entire design inoperative. For these reasons, conventional ECC is not considered to be a suitable solution to reducing SER in SRAM-based FPGAs.

The problems and limitations associated with ECC described above have led to alternative approaches to "hardening" latch-based logic and memory cells. For example, U.S. Pat. No. 6,735,110 teaches addressing SEU conditions in FPGAs by inserting transistors or inductors at the input/output nodes of the cross-coupled inverters of the SRAM cell latch. Unfortunately, those approaches are plagued with the disadvantage of large area consumption and cell performance degradation.

What is needed, therefore, are techniques for hardening latch-based circuits and memory cells that: introduce little or no layout penalty, do not adversely affect circuit speed, and are simple and inexpensive to implement in conventional semiconductor manufacturing process flows.

BRIEF SUMMARY OF THE INVENTION

Apparatus and methods for reducing single-event upsets (SEUs) in latch-based circuitry (e.g., static random access memory (SRAM) cells) and other digital circuitry are disclosed. According to one exemplary embodiment, a latch-based circuit includes a radiation-hardened latch having first and second cross-coupled inverters and first and second programmable resistance devices (PRDs). The first PRD is coupled between the output of the first inverter and the input of the second inverter. The second PRD is coupled between the output of the second inverter and the input of the first inverter. The radiation hardened latch may be used in a static random access memory (SRAM) cell.

According to one aspect of the invention, the PRDs of the radiation-hardened latch may be programmed to non-volatile low or high-resistance states. When SET to a low-resistance state, the latch of the latch-based circuitry may be accessed to read the current logic state stored by the latch or to write a new logic state into the latch. When RESET to a high-resistance state, the latch is radiation-hard and is prevented from generating SEUs.

According to an aspect of the invention, the PRDs comprise phase change devices (PCDs), which may be alternately SET and RESET to non-volatile low and high resistance states by exposing phase change material of the PCDs to different thermal treatments. Examples are provided of two-terminal PCDs and PCDs having three or more terminals. According to another aspect of the invention, the PRDs comprise programmable metallization cells (PMCs). Other non-volatile PRDs may also be employed.

Further features and advantages of the present invention, as well as the structure and operation of various embodiments of the present invention, are described in detail below with respect to accompanying drawings, in which like reference numbers are used to indicate identical or functionally similar elements.

BRIEF DESCRIPTION OF THE DRAWINGS

FIG. 8A is a simplified drawing of an exemplary two-terminal PCD, which may be used to implement the PRDs in the SEU hardened latch circuit in FIG. 6 and the SEU hardened SRAM cell in FIG. 7; and FIG. 8B is a simplified schematic drawing of the two-terminal PCD in FIG. 8A;

FIG. 9A is a cross-sectional drawing of a programmable metallization cell (PMC) during a SET operation, which may be used to implement the PRDs in the SEU hardened latch circuit in FIG. 6 and the SEU hardened SRAM cell in FIG. 7;

FIG. 9B is a cross-sectional view of the PMC in FIG. 9A after the PMC has been SET to a low-resistance state;

FIG. 9C is a cross-sectional view of a PMC during a RESET operation; and

FIG. 9D is a cross-sectional view of the PMC in FIG. 9C after the PMC has been RESET to a high-resistance state.

DETAILED DESCRIPTION OF THE INVENTION

Figure 1A:
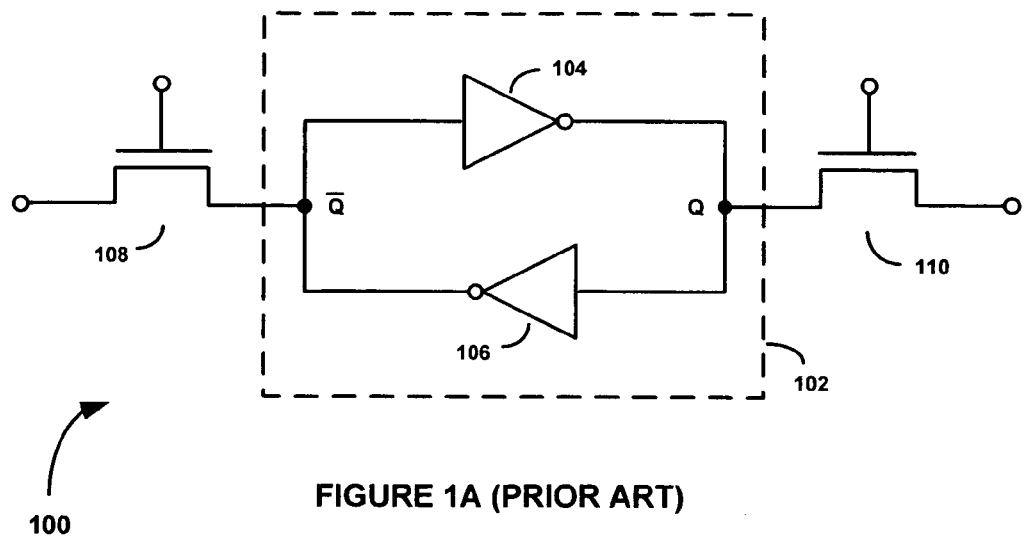
FIG. 1A is a schematic drawing of a conventional static random access memory (SRAM) cell.
Figure 1B:
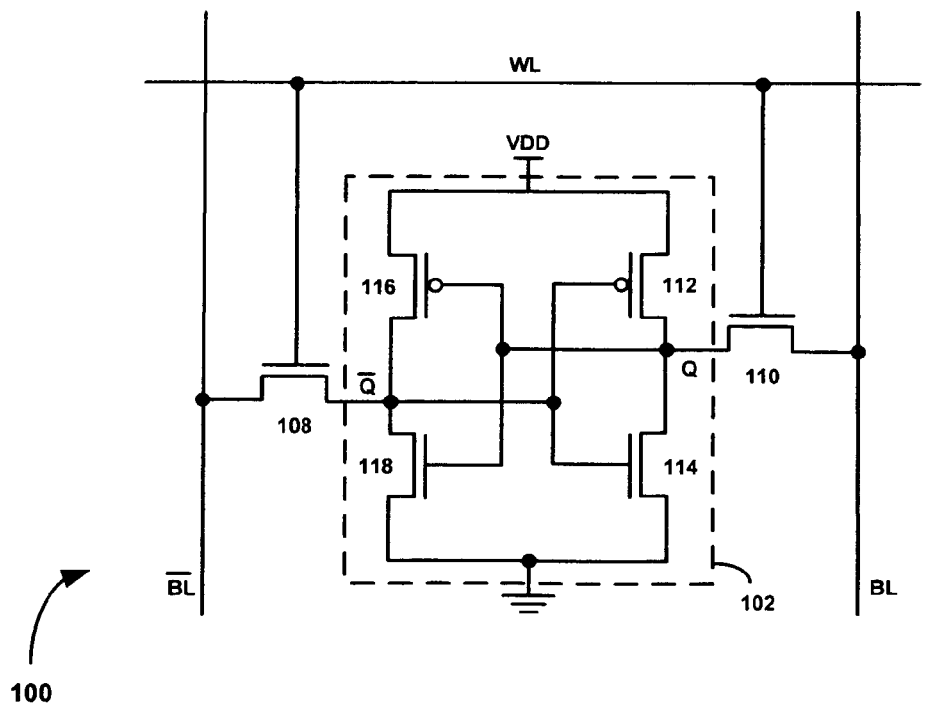
FIG. 1B is a transistor-level schematic drawing of the conventional SRAM cell in FIG. 1A.
Figure 2:
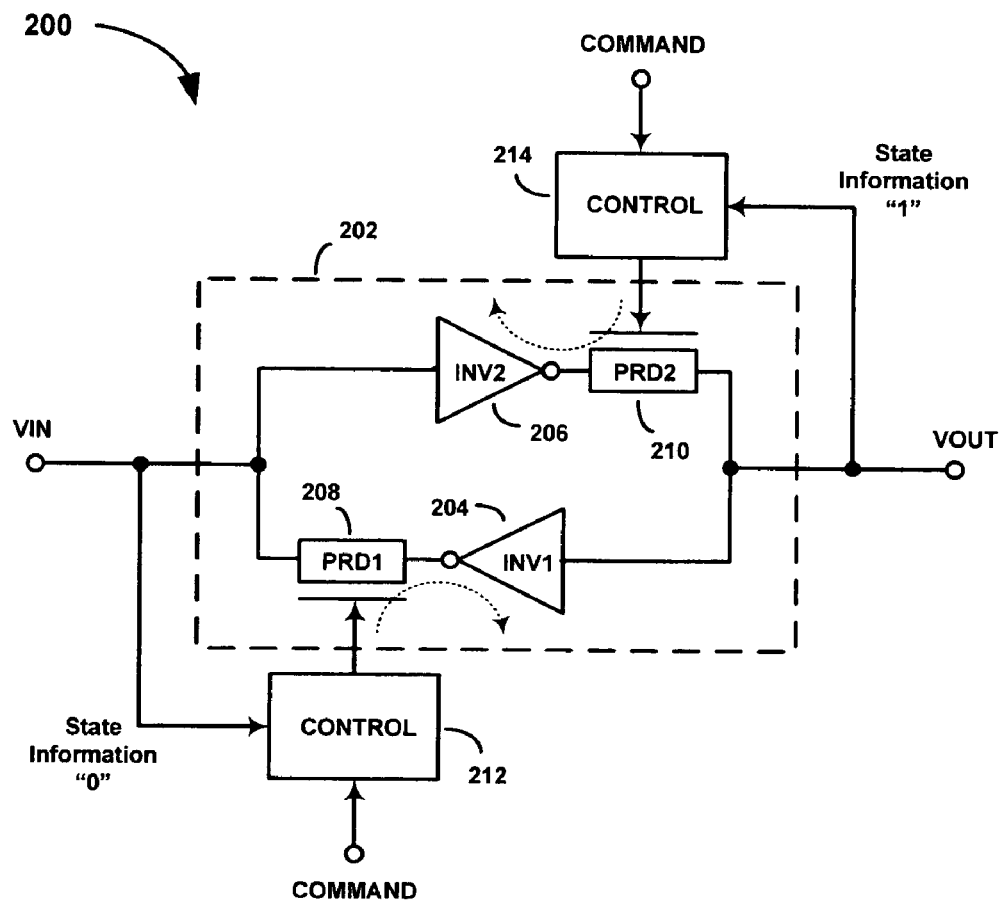
FIG. 2 is a schematic drawing of a single event upset (SEU) hardened latch circuit having multi-terminal programmable resistance devices (PRDs), according to an embodiment of the present invention.

Referring to FIG. 2, there is shown an SEU hardened latch circuit 200, according to an embodiment of the present invention. The SEU hardened latch circuit 200 comprises an SEU hardened latch 202 that includes first and second inverters 204 and 206 (INV1 and INV2) and first and second programmable resistance devices 208 and 210 (PRD1 and PRD2). The first inverter (INV2) 204 has an input that is coupled to a latch output terminal VOUT and an output that is coupled to a first terminal of the first PRD (PRD1) 208. A second terminal of the first PRD (PRD1) 208 is coupled to a latch input terminal VIN. A third terminal of the first PRD (PRD1) 208 is coupled to a control output of a first control module 212, which includes a state information input that is coupled to the latch input terminal VIN. The second inverter (INV2) 206 has an input that is coupled to the latch input terminal VIN and an output that is coupled to a first terminal of the second PRD (PRD2) 210. A second terminal of the second PRD (PRD2) 210 is coupled to the latch output terminal VOUT. A third terminal of the second PRD (PRD2) 210 is coupled to a control output of a second control module 214, which includes a state information input that is coupled to the latch output terminal VOUT. The functions of the first and second control modules 212, 214 will be explained in more detail below.

Figure 3:
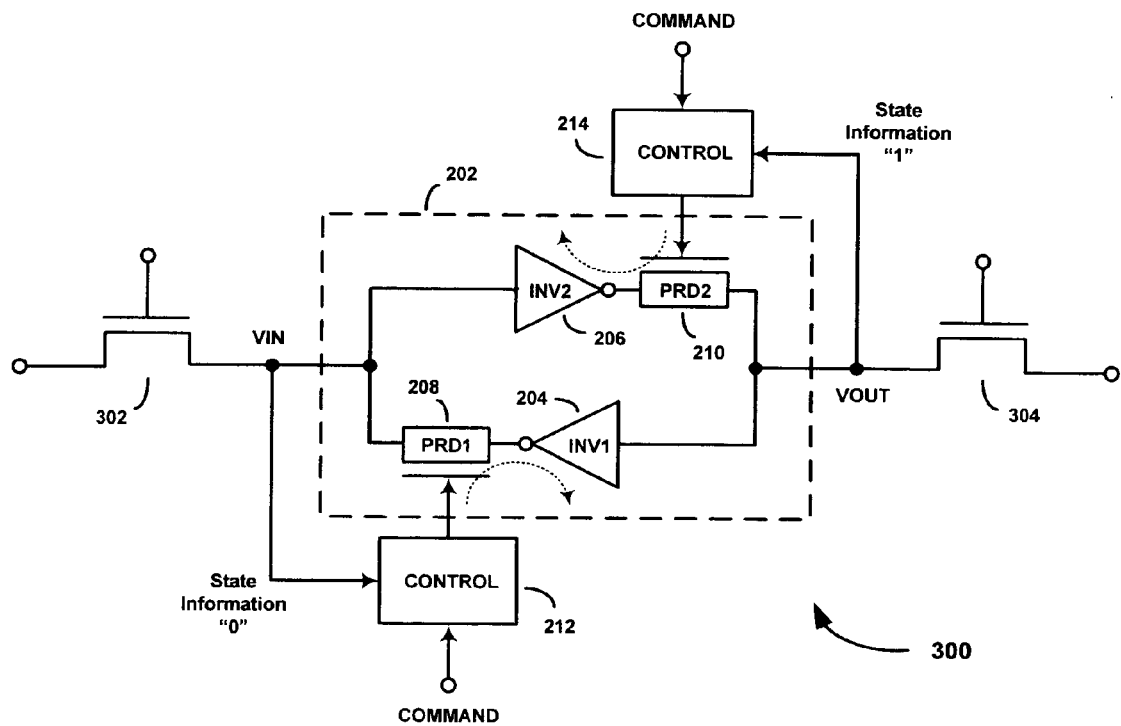
FIG. 3 is a schematic drawing of an SEU hardened SRAM cell having multi-terminal PRDs, according to an embodiment of the present invention.

FIG. 3 is a drawing of an SEU hardened SRAM cell 300, according to an embodiment of the present invention. The SEU hardened SRAM cell 300 incorporates the SEU hardened latch circuit 200 in FIG. 2, and also includes first and second access transistors 302 and 304, each of which has terminals that may be adapted to couple to other circuitry not shown in the drawing, e.g., to word and bit lines of a larger SRAM cell array or to configuration circuitry of an FPGA.

To prevent SEUs, the first and second PRDs (PRD1 and PRD2) 208, 210 in the SEU hardened latch 200 in FIG. 2 or the SEU hardened SRAM cell 300 in FIG. 3 are programmed to a high-resistance state, during times when the latch 202 does not need to be accessed. This configuration prevents the latch 202 from generating SEUs. When the latch 202 must be accessed, the first and second PRDs (PRD1 and PRD2) 208, 210 are programmed to a low-resistance state, thereby allowing the logic state of the latch 202 to be read or altered.

Figure 4:
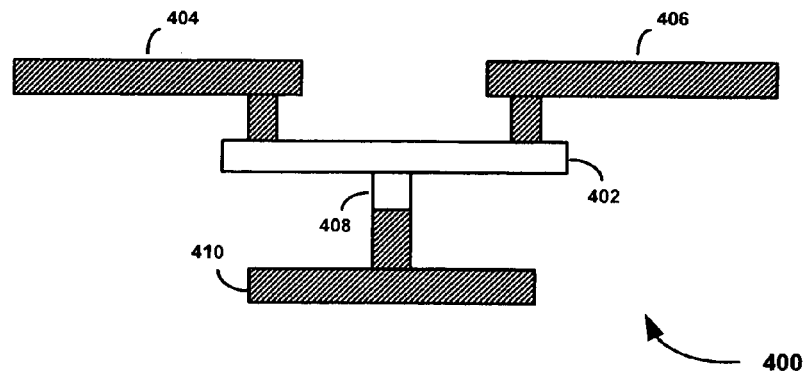
FIG. 4 is a simplified drawing of an exemplary three-terminal phase change device (PCD), which may be used to implement the PRDs in the SEU hardened latch circuit in FIG. 2 and the SEU hardened SRAM cell in FIG. 3.

According to one embodiment of the invention, the first and second PRDs (PRD1 and PRD2) 208, 210 comprise multi-terminal phase change devices (PCDs). FIG. 4 is a simplified drawing of an exemplary three-terminal PCD 400, which may be used to implement the first and second PRDs (PRD1 and PRD2) 208, 210 in the SEU hardened latch circuit 200 in FIG. 2 and the SEU hardened SRAM cell 300 in FIG.

3, according to an embodiment of the present invention. The three-terminal PCD 400 includes first and second electrically conductive terminals 404 and 406, which are bridged together by a phase change material (PCM) element 402. The PCM element 402 is configured so that it is in both thermal and electrical contact with a heating element 408, which forms part of a control terminal 410 through which current is applied to the heating element 408 to activate the same. As explained in more detail below, the heating element is activated in a controlled manner to induce a phase change in the PCM element 402.

According to one aspect of the invention, the PCM element 402 comprises a chalcogenic material or chalcogenic alloy such as, for example, germanium-antimony-tellerium (Ge—Sb—Te), arsenic-antimony-tellurium (As—Sb—Te), tin-antimony-tellurium (Sn—Sb—Te), tantalum-antimony-tellurium (Ta—Sb—Te), niobium-antimony-tellurium (Nb—Sb—Te), vanadium-antimony-tellurium (V—Sb—Te), tantalum-antimony-selenium (Ta—Sb—Se), niobium-antimony-selenium (Nb—Sb—Se), vanadium-antimony-selenium (V—Sb—Se), tungsten-antimony-tellurium (W—Sb—Te), molybdenum-antimony-tellurium (Mo—Sb—Te), chrome-antimony-tellurium (Cr—Sb—Te), tungsten-antimony-selenium (W—Sb—Se), molybdenum-antimony-selenium (Mo—Sb—Se), chrome-antimony-selenium (Cr—Sb—Se), etc. This list of possible materials for the PCM 402 of the PCD 400 is only exemplary and should not be considered exhaustive. Further, whereas the chalcogenic alloys listed above are ternary chalcogenic alloys, binary chalcogenic alloys (e.g., Ga—Sb, In—Sb, In—Se, $Sb_2$—$Te_3$ or Ge—Te) or quarternary alloys (e.g., As—Ge—Sb—Te, Sn—In—Sb—Te, Ag—In—Sb—Te, (Ge—Sn)—Sb—Te, Ge—Sb—(Se—Te) or $Te_{81}$—$Ge_{15}$—$Sb_2$—$S_2$) may also be used to form the PCM element 402 of the PCD 400.

Figure 5:
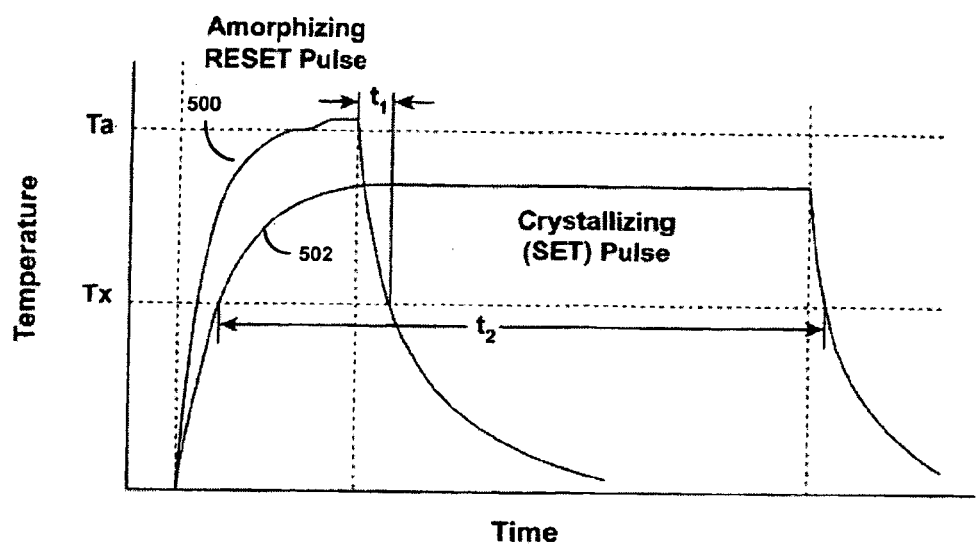
FIG. 5 is graph showing temperature versus time profiles of a phase change material (PCM) SET and RESET to a low-resistance crystalline state and a high-resistance amorphous state, respectively.

PCMs are characterized by a unique ability to change phase between crystalline and amorphous states when exposed to different thermal treatments. As shown in FIG. 5, when a PCM is heated to a temperature above its melting temperature Ta and then abruptly cooled (time t1), as shown by curve 500, the PCM solidifies (i.e., is "RESET") to an amorphous state. By contrast, when the PCM is heated to a temperature between its melting temperature Ta and its crystallization temperature Tx, and then slowly cooled (time t2) as shown by curve 502, the PCM solidifies to a crystalline state.

When the PCM is in the amorphous state, it exhibits a high resistance to electrical currents. However, when in the crystalline state, it exhibits a low resistance. These properties can be exploited to harden the latch 202 in the SEU hardened latch circuit 200 in FIG. 2 and the SEU hardened SRAM cell 300 in FIG. 3. To prevent SEUs, the PRDs (PRD1 and PRD2) 208, 210 are RESET to a high-resistance amorphous state, during times when the latch 202 does not need to be accessed. This configuration prevents the latch 202 from generating SEUs. When the latch 202 must be accessed (e.g., to read or write the logic state stored by the latch 202), the PRDs (PRD1 and PRD2) 208, 210 are SET to a low-resistance crystalline state.

In embodiments where PCDs (e.g., the PCD 400 in FIG. 4) are used to implement the PRDs (PRD1 and PRD2) 208, 210 in the SEU hardened latch 200 in FIG. 2 or the SEU hardened SRAM cell 300 in FIG. 3, the PCDs are SET to low-resistance crystalline states as follows. First, the first and second control modules 212, 214 determine the necessary voltage level of SET voltage pulses to be applied to the control terminals 410 of the PRDs (PRD1 and PRD2) 208, 210, based on the logic levels at the state information inputs of the first and second control modules 212, 214. For example, if the logic level at the latch input terminal VIN is at a logic "0" (as shown in FIGS. 2 and 3), then the SET voltage level applied to the control terminal 410 of the first PCD (i.e., PRD1 208) is set to "0" volts plus the required SET voltage. The voltage pulse shapes (e.g., width, time t2 and amplitude) of the SET voltage pulses applied to the control terminals 410 are controlled by the first and second control modules 212, 214, based on SET commands applied to the COMMAND terminals of the control modules 212, 214.

After the SET voltage pulses are applied to the control terminals 410, a first SET current flows through the first PCD (i.e., PRD1 208), the NMOS pull-down transistor of the first inverter INV1 204, and then to ground, as shown by the dotted arrow in FIGS. 2 and 3. A current sinking device coupled to the VIN and VOUT net may also or alternatively be used to provide a current path for the first SET current. A second SET current flows through the second PCD (i.e., PRD2 210), the PMOS pull-up transistor of the second inverter INV2 206, and to VDD (as is shown by the other dotted arrow in FIGS. 2 and 3). A current sinking device coupled to the VIN and VOUT net may also or alternatively be used to provide a current path for the second SET current.

The first and second SET currents cause the heating elements 408 of the PCDs to increase in temperature, which causes the PCM elements 402 to also increase in temperature by way of Joule heating. Once the temperature in the PCM elements 402 of each of the PCDs reaches a temperature between the melting and crystallizing temperatures Ta and Tx (see FIG. 5), the first and second control modules 212, 214 ramp down the SET pulses slowly for a time t2. This results in low-resistance paths being formed between the conductive terminals 404 and 406 of each of the PCDs. The latch 202 in the SEU hardened latch circuit 200 and the SEU hardened SRAM cell 300 can then be accessed, e.g., to read the current logic state of the latch 202 or to write the latch to a different logic state.

After the latch 202 has been accessed, the PCDs are RESET to harden the latch and thereby prevent it from generating SEUs. Accordingly, similar to the beginning of the SET operation described above, the RESET operation begins by determining the necessary voltage levels of RESET voltage pulses to be applied to the control terminals 410 of the PRDs (PRD1 and PRD2) 208, 210, based on the logic levels at the state information inputs of the first and second control modules 212, 214. For example, if the logic level at the latch output terminal VOUT is at a logic "1" (as shown in FIGS. 2 and 3), then the RESET voltage level applied to the control terminal 410 of the second PCD (i.e., PRD2 210) is set to "1" volts plus the required RESET voltage. The voltage pulse shapes (e.g., width, time t1 and amplitude) of the RESET voltage pulses applied to the control terminals 410 are controlled by the control modules 212, 214, based on RESET commands applied to the COMMAND terminals of the control modules 212, 214.

After the RESET voltage pulses are applied to the control terminals 410, a first RESET current flows through the first PCD (i.e., PRD1 208), the NMOS pull-down transistor of the first inverter INV1 204, and then to ground, as shown by the dotted arrow in FIGS. 2 and 3. A current sinking device coupled to the VIN and VOUT net may also or alternatively be used to provide a current path for the first RESET current. A second RESET current flows through the second PCD (i.e., PRD2 210), the PMOS pull-up transistor of the second inverter INV2 206, and to VDD (as is shown by the other dotted arrow in FIGS. 2 and 3). A current sinking device coupled to the VIN and VOUT net may also or alternatively be used to provide a current path for the second RESET current.

The RESET currents cause the heating elements 408 to increase in temperature, which causes the PCM elements 402 of the PCDs to also increase in temperature by way of Joule heating. Once the temperature in the PCM elements 402 of each of the PCDs reaches a temperature above the PCM elements' melting temperature Ta (see FIG. 5), the control modules 212, 214 ramp down the RESET pulses quickly for a time t1. This results in high-resistance paths being formed between the conductive terminals 404 and 406 of each of the PCDs. In this state, the latch 202 is hardened against generating SEUs.

While the exemplary PCD-based SEU hardened latch circuit and SEU hardened SRAM cell have been described in terms of using three-terminal PCDs, other multi-terminal PCDs may be alternatively used. Other multi-terminal PCDs which may be used are disclosed in co-pending and commonly assigned U.S. patent application No. 11/267,788, which is hereby incorporated by reference in its entirety.

Figure 6:
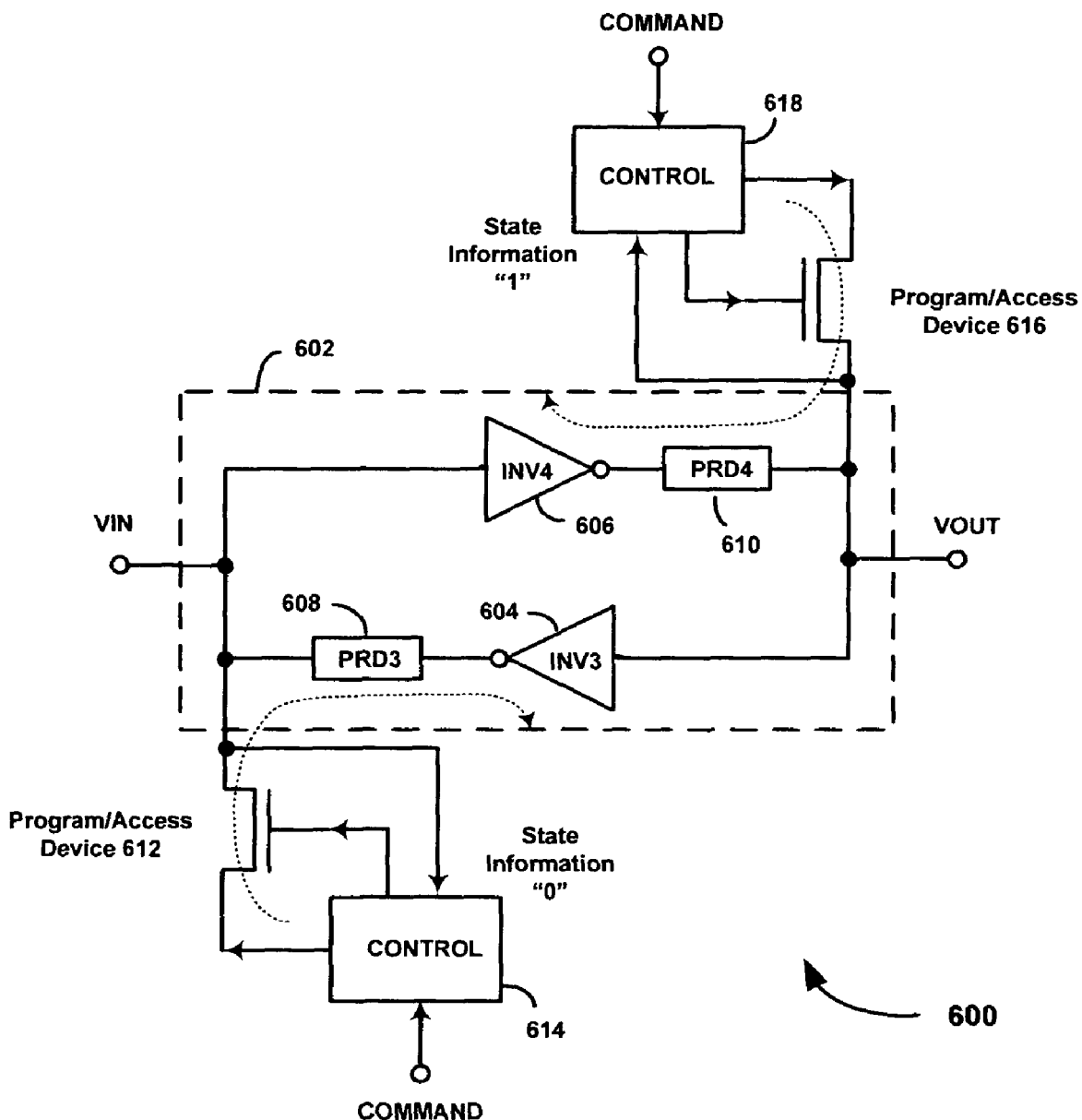
FIG. 6 is a schematic drawing of a single event upset (SEU) hardened latch circuit having two-terminal programmable resistance devices (PRDs), according to an embodiment of the present invention.

Further, whereas multi-terminal PRDs having three or more terminals have been described in the exemplary embodiments above, two-terminal programmable resistance devices (PRDs) may alternatively be used to harden latch-based logic and SRAM cells. FIG. 6 is drawing of an SEU hardened latch circuit 600 using two-terminal PRDs, according to an embodiment of the present invention. The SEU-hardened latch circuit 600 comprises an SEU hardened latch 602 that includes first and second inverters 604 and 606 (INV3 and INV4) and first and second two-terminal PRDs 608 and 610 (PRD3 and PRD4). The first inverter (INV3) 604 has in input that is coupled to a latch output terminal VOUT and an output that is coupled to a first terminal of the first two-terminal PRD (PRD3) 608. A second terminal of the first PRD (PRD3) 608 is coupled to a latch input terminal VIN. The latch input terminal VIN is also coupled to a first terminal of a first program/access device 612 (e.g., to the source terminal of an NMOS transistor) and to a state information input of a first control module 614. The second inverter (INV4) 606 has an input that is coupled to the latch input terminal VIN and an output that is coupled to a first terminal of the second two terminal PRD (PRD4) 610. A second terminal of the second PRD (PRD4) 610 is coupled to the latch output terminal VOUT. The latch output terminal VOUT is also coupled to a first terminal of a second program/access device 616 (e.g., to the source terminal of an NMOS transistor) and to a state information input of a second control module 618. The functions of the first and second program/access devices 612, 616 and first and second control modules 614, 618 will be explained in more detail below.

Figure 7:
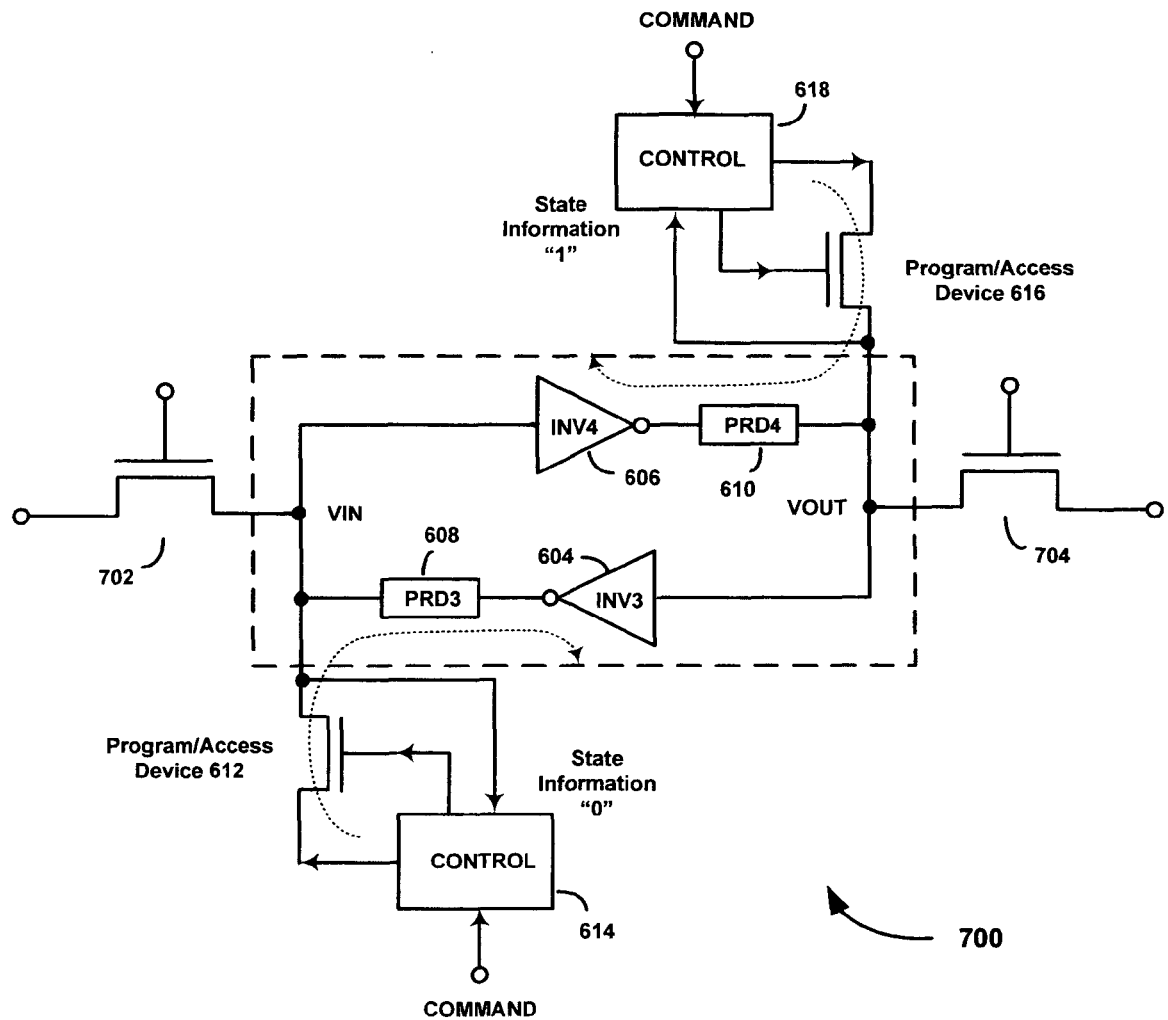
FIG. 7 is a schematic drawing of an SEU hardened SRAM cell having two-terminal PRDs, according to an embodiment of the present invention.

FIG. 7 is a drawing of an SEU hardened SRAM cell 700, according to an embodiment of the present invention. The SEU hardened SRAM cell 700 incorporates the SEU hardened latch circuit 600 in FIG. 6, and also includes first and second access transistors 702 and 704, each of which may be adapted to couple to other circuitry not shown in the drawing, e.g., to word and bit lines of a larger SRAM cell array or to configuration circuitry of an FPGA.

To prevent SEUs, the first and second PRDs (PRD3 and PRD4) 608, 610 in the SEU hardened latch 600 in FIG. 6 or the SEU hardened SRAM cell 700 in FIG. 7 are programmed to a high-resistance state, during times when the latch 602 does not need to be accessed. This configuration prevents the latch 602 from generating SEUs. When the latch 602 must be accessed, the first and second PRDs (PRD3 and PRD4) 608, 610 are programmed to a low-resistance state, thereby allowing the logic state of the latch 602 to be read or altered.

According to one embodiment of the invention, each of the first and second PRDs (PRD3 and PRD4) 608, 610 in the SEU hardened latch circuit 600 in FIG. 6 and the SEU hardened SRAM cell 700 in FIG. 7 comprises a two-terminal PCD. FIG. 8A is a drawing showing a two-terminal PCD 800, which may be used for this purpose. An electrical schematic of the two-terminal PCD 800 is shown in FIG. 8B. The two-terminal PCD 800 comprises a PCM element 802 and a heating element 804, which are coupled between first and second conducting terminals 806, 808. The heating element 804 is in both electrical and thermal contact with the PCM element 802. The PCM element 802 may be SET and RESET to low-resistance and high-resistance states, respectively, similar to that described above (see FIG. 5), and may comprise any suitable type of PCM such as, for example, the PCM types describe above.

In embodiments where a two-terminal PCD (e.g., the PCD 800 in FIG. 8A) is used to implement the first and second PRDs (PRD3 and PRD4) 608, 610 in the SEU hardened latch 600 in FIG. 6 or the SEU hardened SRAM cell 700 in FIG. 7, the PCDs are SET to low-resistance crystalline states as follows. First, the first and second control modules 614, 618 determine the necessary voltage level of SET voltage pulses to be applied to the gate and drain of each of the first and second program/access devices 612, 616, based on the logic levels at the state information inputs of the first and second control modules 614, 618. For example, if the logic level at the latch input terminal VIN is at a logic "0" (as shown in FIGS. 6 and 7), then the voltage is set to "0" volts plus the required SET voltage. The voltage shapes (e.g., width, time t2 and amplitude) of the SET voltage pulses applied to the first and second PCDs (PRD3 and PRD4) 608, 610 are controlled by the first and second control modules 614, 618, based on SET commands applied to the COMMAND terminals of the control modules 614, 618. The voltage pulses are controlled so that they are sufficient to SET the first and second PCDs (PRD3 and PRD4) 608, 610, but not so high as to disturb the logic state of the latch 602.

After the SET voltage pulses are applied, a first SET current flows through the first program/access device 612, the first PCD (i.e., PRD3 608), the NMOS pull-down transistor of the first inverter (INV3) 604, and then to ground, as shown by the dotted arrow in FIGS. 6 and 7. A current sinking device coupled to the VIN and VOUT net may also or alternatively be used to provide a current path for the first SET current. A second SET current flows through the second program/access device 616, the second PCD (i.e., PRD4 610), the PMOS pull-up transistor of the second inverter (INV4) 606, and then to VDD (as is shown by the other dotted arrow in FIGS. 6 and 7). A current sinking device coupled to the VIN and VOUT net may also or alternatively be used to provide a current path for the second SET current.

The first and second SET currents cause the heating elements 804 of the PCDs to increase in temperature by way of Joule heating. Once the temperature in the PCM elements 802 of the PCDs reaches a temperature between the melting and crystallizing temperatures Ta and Tx (see FIG. 5), the first and second control modules 614, 618 ramp down the SET pulses slowly for a time t2. This results in low-resistance paths being formed between the first and second conductive terminals 806 of each of the PCDs. The latch 602 in the SEU hardened latch circuit 600 and the SEU hardened SRAM cell 700 can then be accessed, e.g., to read the current logic state of the latch 602 or to write the latch 602 to a different logic state.

After the latch 602 has been accessed, the PCDs are RESET to harden the latch 602 and thereby prevent it from generating SEUs. Accordingly, similar to the beginning of the SET operation described above, the RESET operation begins by determining the necessary voltage level of RESET voltage pulses to be applied to the gate and drain of each of the first and second program/access devices 612, 616, based on the logic levels at the state information inputs of the first and second control modules 614, 618. For example, if the logic level at the latch input terminal VIN is at a logic "1" (as shown in FIGS. 6 and 7), then the voltage is set to "1" volts pulse the required RESET voltage. of the RESET voltage pulses applied to the first an and second PCDs (PRD3 and PRD4) 608, 610 are controlled by the first and second control modules 614, 618, based on RESET commands applied to the COMMAND terminals of the control modules 614, 618. The voltage pulses are controlled so that they are sufficient to RESET the first and second PCDs (PRD3 and PRD4) 608, 610, but not so high as to disturb the logic state of the latch 602.

After the RESET voltage pulses are applied, a first RESET current flows through the first program/access device 612, the first PCD (i.e., PRD3 608), the NMOS pull-down transistor of the first inverter (INV3) 604, and then to ground, as shown by the dotted arrow in FIGS. 6 and 7. A current sinking device coupled to the VIN and VOUT net may also or alternatively be used to provide a current path for the first RESET current. A second RESET current flows through the second program/access device 616, the second PCD (i.e., PRD4 610), the PMOS pull-up transistor of the second inverter (INV4) 606, and then to VDD (as is shown by the other dotted arrow in FIGS. 6 and 7). A current sinking device coupled to the VIN and VOUT net may also or alternatively be used to provide a current path for the second RESET current.

The first and second RESET currents cause the heating elements 804 of the PCDs to increase in temperature by way of Joule heating. Once the temperature in the PCM elements 802 of each of the PCDs reaches a temperature above the PCM elements' melting temperature (see FIG. 5), the control modules 614, 618 ramp down the RESET pulses quickly for a time tl. This results in high-resistance paths being formed between the conductive terminals 806, 808 of each of the PCDs. In this state, the latch 602 is hardened against generating SEUs.

According to an alternative embodiment, each of the first and second PRDs (PRD3 and PRD4) 608, 610 in the SEU hardened latch circuit 600 in FIG. 6 and the SEU hardened SRAM cell 700 in FIG. 7 comprises a programmable metallization cell (PMC). As shown in FIG. 9A, the PMC comprises a solid electrolyte 902 such as, for example, silver selenide ($Ag_2Se$), which is formed between an electrochemically active metallic anode 904 (e.g., Ag, Cu, etc.) and a cathode 906, which operates as a source of electrons. Further details describing the construction and operation of the PMC 900 are described in M. Kozicki et al., "Nanoscale Memory Elements Based on Solid State Electrolyte," which is hereby incorporated into the present disclosure by reference.

Similar to a PCD, a PMC is non-volatile and may be configured between SET and RESET states over and over again. FIG. 9B shows the PMC 900 in a programmed (i.e., SET) low-resistance state. The PMC 900 is programmed by applying a voltage ($V_{anode} > V_{cathode}$) across the cell. As shown in FIG. 9A, the applied bias causes electrons from the cathode 906 and $Ag^+$ ions from the anode 904 to be injected into the electrolyte 902, where they are reduced ($M^+ + e^- \rightarrow M^0$) into Ag atoms. The reaction continues until a conductive chain 908 of Ag atoms is formed between the anode 904 and cathode 906, as shown in FIG. 9B. Once SET, the latch 602 in the SEU hardened latch circuit 600 in FIG. 6 and the SEU hardened SRAM cell 700 in FIG. 7 is accessible so that current logic state of the logic 602 may be read or altered.

After the latch 602 is accessed, the PMC 900 may be RESET to a high-resistance state to prevent SEUs. To configure the PMC 900 to this high-resistance state, a voltage having a polarity opposite to that used to SET the cell is applied across the cell 900. The applied voltage causes Ag atoms in the electrolyte 902 to ionize. As illustrated in FIG. 9C, the ionization process creates $Ag^+$ ions and electrons, which are attracted to and collected by the anode 904 and cathode 906, respectively. Eventually, the cell 900 will be completely RESET as shown in FIG. 9D. In this state, the latch 602 in the SEU hardened latch circuit 600 in FIG. 6 and SEU hardened SRAM cell 700 in FIG. 7 is hardened against generating SEUs.

From a processing perspective, the PRDs in the various embodiments described above can be configured above the active area of transistors, either at the contact level or above the first metallization layer (M1). Hence, an added benefit of using these devices is that they do not introduce a significant area penalty in integrated circuits in which they are configured. When multi-terminal PRDs are integrated at the contact level, less than a 10% cell area increase is incurred due to the addition of the two additional contacts for the programming terminals of the two PRDs, and no area penalty results if the PRDs are integrated above M1.

The SEU hardened latch-based circuits and SRAM cells described in this disclosure can be employed in a variety of applications. For example, according to one aspect of the invention the SEU hardened SRAM cells are employed as configuration elements in an FPGA. Of course, as will be appreciated by those of ordinary skill in the art this is only one of many applications in which the SEU hardened circuitry may be used.

Although the present invention has been described with reference to specific embodiments thereof, these embodiments are merely illustrative, and not restrictive, of the present invention. For example, whereas the exemplary embodiments have been shown and described in the context of latch-based circuitry and latch-based SRAM memory cells, the programmable resistance devices (e.g., PCDs and PMCs) may be used harden other types of circuits and memory cells that employ or do not employ latch-based circuitry. Additionally, while various examples of different PRD types (e.g., PCDs and PMCs) have been disclosed, other types of non-volatile PRDs may be used. For example, carbon nanotube nano-electromechanical (CNT-NEM) or metal nano-electromechanical device technologies may also be used to implement the PRDs. Further, whereas the command modules in the various embodiments are shown and described as relying on state information to determine the appropriate shape voltage pulse shape, width etc., alternatively, current pulses can be used to avoid the need to rely on state information. The control modules can also be dedicated circuits or circuits that are shared by other resources of the semiconductor chip (e.g., other logic or memory cell structures) in which the SEU hardened latch or SRAM memory cell is fabricated. Still further, whereas separate first and second control modules are shown to control the SET and RESET operations of the first and second PRDs in the various disclosed embodiments, those of ordinary skill in the art will readily appreciate and understand that a single control module for both PRDs may be used instead. Other modifications or changes to the specifically disclosed exemplary embodiments will be suggested to persons skilled in the art and are to be included within the spirit and purview of this application and scope of the appended claims.

What is claimed is:

1. A radiation-hard latch-based circuit, comprising:
a first inverter;
a second inverter;
a first programmable resistance device (PRD) having a first terminal, a second terminal, and a third terminal, wherein said first terminal of said first PRD is coupled to an output of said first inverter, said second terminal of said first PRD is coupled to an input of said second inverter, and said third terminal of said first PRD is coupled to a first control module; and
a second PRD coupled between an output of said second inverter and an input of said first inverter, wherein said first and second PRDs facilitate access of said radiation-hard latch-based circuit in response to a control signal of said first control module.

2. The radiation-hard latch-based circuit of claim 1 wherein said first and second PRDs comprise first and second phase changed devices (PCDs).

3. The radiation-hard latch-based circuit of claim 2 wherein said first and second PCDs comprise two-terminal PCDs.

4. The radiation-hard latch-based circuit of claim 1 wherein said second PRD includes a first terminal, a second terminal, and a third terminal, wherein said first terminal of said second PRD is coupled to an output of said second inverter, said second terminal of said PRD is coupled to an input of said first inverter, and said third terminal of said second PRD is coupled to a second control module.

5. The radiation-hard latch-based circuit of claim 1 wherein said first and second PRDs comprise first and second programmable metallization cells (PMCs).

6. The radiation-hard latch-based circuit of claim 1 wherein said first and second PRDs comprise non-volatile devices.

7. A radiation-hard digital circuit, comprising:
means for storing a digital logic state;
at least on programmable resistance device (PRD) coupled to said means for storing a digital logic state operable to prevent said means for storing a digital logic state from changing a stored logic state depending on a programmed resistance value of said at least one PRD.

8. The radiation-hard digital circuit of claim 7 wherein said means for storing a digital logic state comprises a latch circuit.

9. The radiation-hard digital circuit of claim 7 wherein said means for storing a digital logic state comprises a static random access memory (SRAM) cell.

10. The radiation-hard-digital circuit of claim 7 wherein said at least one PRD comprises at least one phase change device (PCD).

11. The radiation-hard-digital circuit of claim 10 wherein said at least one PCD comprises at least one two-terminal PCD.

12. The radiation-hard-digital circuit of claim 10 wherein said at least one PCD comprises a PCD having three or more terminals.

13. The radiation-hard-digital circuit of claim 7 wherein said at least one PRD comprises at least one programmable metallization cell (PMC).

14. The radiation-hard digital circuit of claim 7 wherein said at least one PRD comprises a non-volatile device.

15. A method of hardening a single event upset (SEU) susceptible logic circuit from radiation, comprising:
applying a power source to at least one programmable resistance device (PRD) that is electrically coupled to at least one circuit element configured to store, or configured to participate in the storage of, a logic state;
controlling said power source to cause said at least one PRD to change from a low-resistance state to a high-resistance state;
removing said power source to leave said at least one PRD in a non-volatile, programmed high-resistance state; and
preventing access to said at least one circuit element in response to said programmed high-resistance state of said at least one PRD.

16. The method of claim 15 wherein said at least one PRD comprises at least one phase change device (PCD).

17. The method of claim 16 wherein said at least one PCD comprises a two-terminal PCD.

18. The method of claim 16 said at least one PCD comprises at least one PCD having three or more terminals.

19. The method of claim 15 wherein said at least one PRD comprises at least one programmable metallization cell (PMC).

20. The method of claim 15 wherein said at least one circuit element comprises a latch-based circuit.

21. The method of claim 15 wherein said at least one circuit element comprises a memory cell.

22. The method of claim 21 wherein said at least one memory cell comprises at least one static random access memory (SRAM) cell.

23. The method of claim 15 wherein said at least one circuit element comprise at least one transistor.

* * * * *